(12) United States Patent
Fiorelli

(10) Patent No.: US 10,523,275 B2
(45) Date of Patent: Dec. 31, 2019

(54) COUPLING CIRCUIT FOR POWER LINE COMMUNICATIONS

(71) Applicant: STMicroelectronics S.r.l., Agrate Brianza (IT)

(72) Inventor: Riccardo Fiorelli, Monticello Brianza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/269,324

(22) Filed: Feb. 6, 2019

(65) Prior Publication Data

US 2019/0173526 A1    Jun. 6, 2019

Related U.S. Application Data

(63) Continuation of application No. 15/607,256, filed on May 26, 2017, now Pat. No. 10,243,617.

(30) Foreign Application Priority Data

Oct. 19, 2016   (IT) .................. 102016000105056

(51) Int. Cl.
*H04B 3/56*     (2006.01)
*H03H 7/00*     (2006.01)
*H01P 1/10*     (2006.01)

(52) U.S. Cl.
CPC ............... *H04B 3/56* (2013.01); *H01P 1/10* (2013.01); *H03H 7/004* (2013.01); *H04B 2203/5404* (2013.01); *H04B 2203/5483* (2013.01); *H04B 2203/5491* (2013.01)

(58) Field of Classification Search
CPC ... H04B 3/56; H04B 2203/5483; H03H 7/004
USPC ...................................... 333/24 R
See application file for complete search history.

(56) References Cited

U.S. PATENT DOCUMENTS

| | | |
|---|---|---|
| 3,943,435 A | 3/1976 | DeJarnette |
| 4,012,733 A | 3/1977 | Whyte |
| 4,427,900 A | 1/1984 | Aumont et al. |
| 5,644,598 A | 7/1997 | Bidese |
| 8,896,393 B2 | 11/2014 | Fiorelli et al. |
| 2003/0179080 A1 | 9/2003 | Mollenkopf et al. |
| 2009/0085726 A1 | 4/2009 | Radtke |

*Primary Examiner* — Dean O Takaoka
(74) *Attorney, Agent, or Firm* — Slater Matsil, LLP

(57) ABSTRACT

A coupling circuit for power line communications includes a coupling transformer having first and second mutually coupled windings, with the first winding connectable to a power line. The second winding includes a pair of intermediate taps with one or more tuning inductor therebetween. The inductor or inductors are set between a first portion and a second portion of the second winding of the coupling transformer. A switch member is provided coupled with the inductor. The switch member is selectively actuatable to short-circuit the inductor.

20 Claims, 2 Drawing Sheets

COUPLING CIRCUIT FOR POWER LINE COMMUNICATIONS

CROSS-REFERENCE TO RELATED APPLICATIONS

The present application is a continuation of U.S. patent application Ser. No. 15/607,256, filed on May 26, 2017, which claims priority to Italian Patent Application No. 102016000105056, filed on Oct. 19, 2016, which applications are hereby incorporated by reference herein in their entirety.

TECHNICAL FIELD

Embodiments of the invention relate to a coupling circuit for power line communications.

BACKGROUND

A power line communication device may use a line coupling circuit to exchange communication signals with a (power) line, e.g., a power line in an electrical distribution grid.

The coupling circuit aims at improving signal exchange at the frequency of the communication channel and may include a signal transformer for isolation and differential coupling together with an inductor and a capacitor (that is, an LC circuit) for facilitating a "tuned" signal coupling to the power line.

State-of-the-art power line communication solutions may be capable of switching from one communication frequency channel to another. The capability of tuning the line coupling circuit to different communication channels may thus represent an asset.

A way of providing such a capability may involve arranging a switch (e.g., an opto-switch or relay) in parallel to a tuning inductor.

Such an arrangement may turn out to be expensive. Also, the inductor may be typically placed on the "high-voltage" (that is, power line) side of the coupling transformer, thus dictating isolation constrains adding to the cost and complexity of the solution. In addition, the switch may produce an appreciable power loss (e.g., with a Ron value for an electronic switch such as a transistor of about 0.5-1 Ohm).

Moving the switch and the tuning inductor to the low-voltage side, where the power line communication device is located, has been proposed as a way to palliate such drawbacks.

When resorting to such a solution, the switch may still be expensive. Even without stringent isolation constraint, it may still be required to operate with a relatively large signal across it (e.g., 36-40 V peak-to-peak), with significant losses in the switch.

SUMMARY

The description relates to power line communications. One or more embodiments may be applied, e.g., in "smart" electric distribution grids.

One or more embodiments may also relate to corresponding power line communication device, a corresponding power line communication network as well as to a corresponding method.

One or more embodiments may provide a simple and cost-effective solution for adapting a power line communication coupling circuit to different power lines.

One or more embodiments may offer one or more of the following advantages: cost saving, space saving, high-voltage isolation constraints reduced (and virtually dispensed with), and reduced signal loss (e.g., Ron about 0.05 Ohm).

One or more embodiments may include an inexpensive, small, low-Ron electronic switch (e.g., including MOSFETs such as NMOS transistors).

In one or more embodiments a simple switch may be used, connected in parallel with an inductor at a pair of center tap pins of a coupling transformer.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 indicates as a whole a coupling circuit for use e.g., in power line communications involving exchange of signals between a power line communication device (hereinafter "communication unit") U and a power line PL.

Such an arrangement may be adopted e.g., in a "smart" power distribution grid to permit uni- or bi-directional transmission over the power line PL of (e.g., digital) signals related for instance to controlled delivery of electric power as metered by a meter M. These "smart" grid arrangements are known in the art and are becoming increasingly popular in various countries, thus making it unnecessary to provide a more detailed description herein.

Also, reference to such a possible field of application is not to be construed, even indirectly, in a limiting sense of the embodiments.

Figure 1:
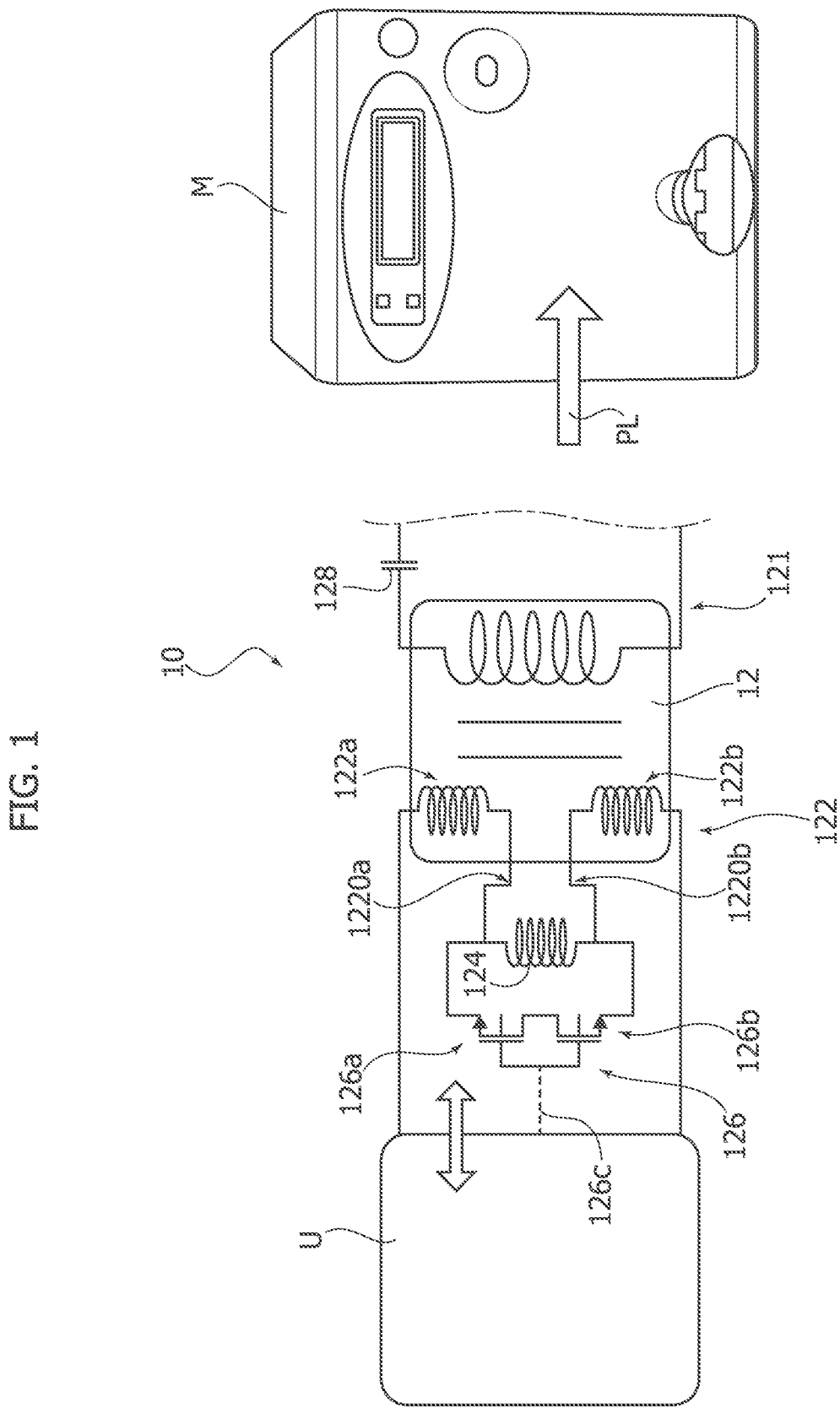
FIG. 1 is a circuit diagram exemplary of one or more embodiments, with a schematic representation of a possible context of use thereof.

In one or more embodiments a coupling circuit 10 as exemplified in FIG. 1 may include a coupling transformer 12 including two windings 121 and 122, which are mutually coupled to form a mutual inductance between a primary winding and a secondary winding of the coupling transformer 12.

In that respect a tendency may be noted in power line communication techniques to refer to the winding—here 121—intended to be coupled with the "high-voltage" side (that is the power line PL) as the "primary" winding of the coupling transformer; similarly, the winding—here 122—intended to be connected to the "low-voltage" side (e.g., the communication unit U) is oftentimes referred to as "secondary winding" of the coupling transformer.

One or more embodiments may provide a structure of the coupling transformer 12 with a center tap on the "secondary" side, that is, in the winding 122.

More specifically, in one or more embodiments, the winding 122 of the coupling transformer 12 may include a pair of intermediate taps 1220a, 1220b with at least one tuning inductor 124 arranged therebetween.

Therefore, in one or more embodiments as exemplified in FIG. 1, the inductor 124 may be set between a first portion or section 122a and a second portion or section 122b of the winding 122. In one or more embodiments, the locations of the taps 1220a, 1220b may be selected in such a way that the two sections 122a, 122b are symmetrical, that is include substantially the same number of coils, so that the taps 1220a, 1220b are arranged "at the center" of the winding 122.

In one or more embodiments, as exemplified in FIG. 1, a switch member 126 may be provided, acting across the terminals of the tuning inductor 124.

In one or more embodiments, the switch member 126 may be selectively actuatable (e.g., under control from the communication unit U) in such a way to be either "off" (non-conductive) or "on" (conductive).

In the former case (switch member 126 "off") the tuning inductor 124 will be arranged in series with the sections 122a, 122b of the winding 122.

In the latter case (switch member 126 "on") the tuning inductor 124 will be short-circuited by the switch member 126 with the sections 122a, 122b of the winding 122 directly in series therebetween.

In one or more embodiments the inductor 124 may thus be:
- "active" between the sections 122a, 122b of the winding 122, e.g., with the switch member 126 "off", or
- short-circuited and thus virtually removed (inductance value nominally equal to zero) between the sections 122a, 122b of the winding 122, which are connected to each other e.g., by the switch member 126 in an "on" condition.

In that way the possibility exists of selectively varying the inductance value between the taps 1220a, 1220b with a view to providing adaptive impedance coupling ("tuning") of the communication unit U with the power line PL, possibly in conjunction with a capacitor 128 which may be provided on the "high-voltage" side of the coupling arrangement.

For instance, in one or more embodiments, the capacitor 128 may be arranged in series with the "primary" winding 121 at the high-voltage side of the coupling transformer 12.

In one or more embodiments, a switch member 126 as exemplified in FIG. 1 may include at least one electronic switch, such as a transistor e.g., a MOSFET.

In one or more embodiments, the switch member 126 may include two complementary switches 126a, 126b such as a pair of (e.g., NMOS) transistors coupled in a mirror-like arrangement e.g., with:

- common control terminals (e.g., gates) driven by a digital control signal as possibly provided by the communication unit U over a line 126c, and
- their current paths (e.g., source-drain paths) arranged in series, possibly with the current generating terminals (e.g., sources) of the transistors 126a, 126b coupled with the terminals of the tuning inductor 124 and the current sink terminals (e.g., drains) of the transistors 126a, 126b coupled to each other.

Reference to "control", "current generating" and "current sink" terminals is intended to take into account that, in one or more embodiments, the electronic switch or switches 126 may include, in the place of field effect transistors such as MOSFETs, e.g., bipolar transistors—BJT (or similar devices) with base, emitter and collector as the "control", "current generating" and "current sink" terminals.

In one or more embodiments, the switch member 126 may include discrete component(s) with respect to the other elements of the coupling circuit 10 (e.g., by being included in the communication unit U).

In one or more embodiments, the switch member 126 may be integrated in the coupling circuit 10.

It will be appreciated that, in one or more embodiments, the central location of the taps 1220a, 1220b, possibly in conjunction with the specular arrangement of two switches 126a, 126b may facilitate reducing power absorption.

Figure 2:
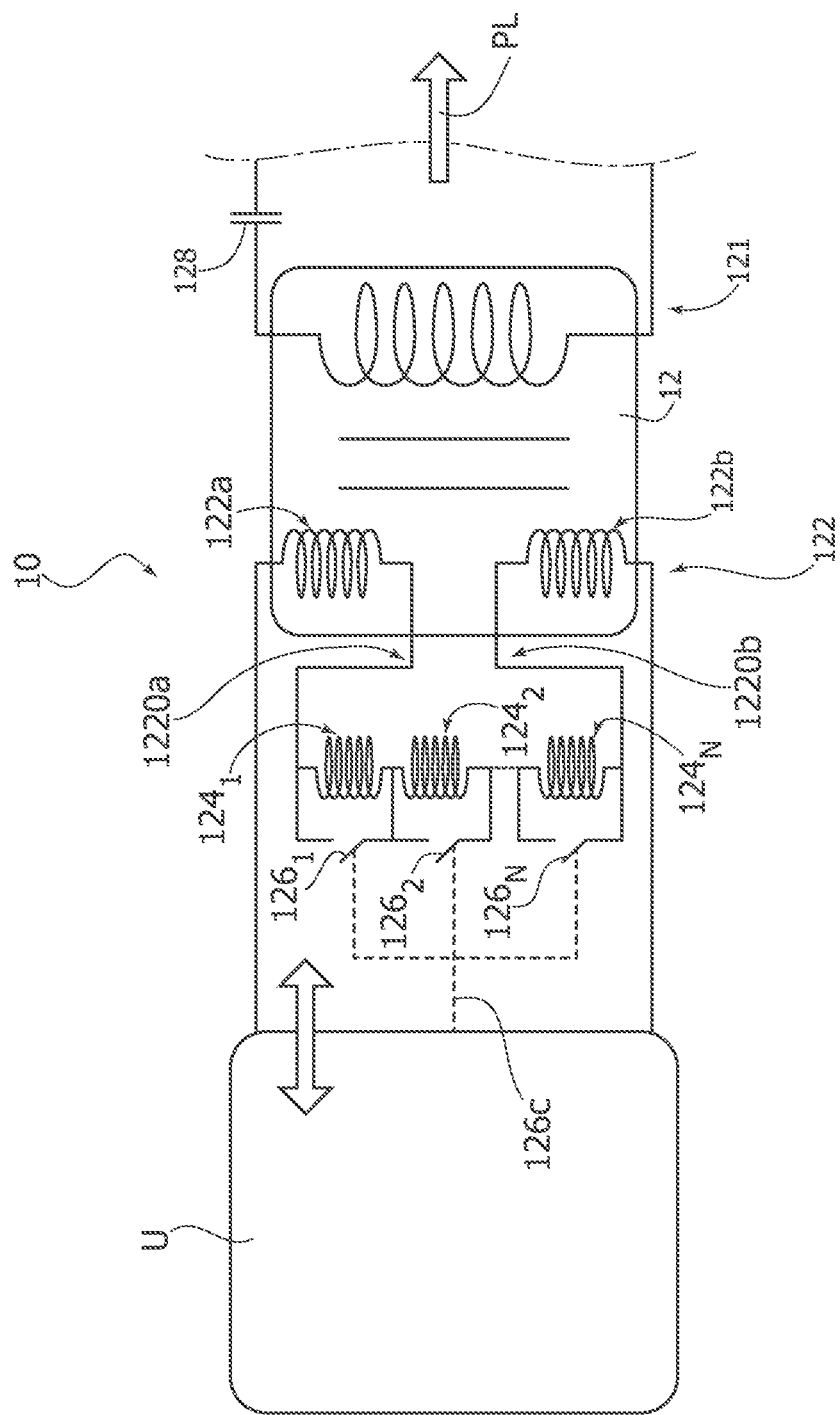
FIG. 2 is a circuit diagram exemplary of possible developments of one or more embodiments.

FIG. 2 is exemplary of possible developments of one or more embodiments wherein a plurality of tuning inductors 1241, 1242, . . . , 124N may be set between the taps 1220a, 1220b of the winding 122.

In one or more embodiments the plurality of inductors 1241, 1242, . . . , 124N may be arranged in series.

In one or more embodiments, the inductors 1241, 1242, . . . , 124N may have a same inductance value, or have different inductance values.

In one or more embodiments, respective switch members 1261, 1262, . . . , 126N, may be coupled with the inductors 1241, 1242, . . . , 124N, so that the inductors 1241, 1242, . . . , 124N may be either short-circuited (with a respective switch member "on", that is conductive) or active (with a respective switch member "off", that is non-conductive) and thus interposed in a series arrangement between the two taps 1220a, 1220b, namely between the sections 122a, 122b of the winding 122 thus playing a tuning role (in possible combination with the capacitor 128).

In one or more embodiments, switching "on" and "off" the switch members 1261, 1262, . . . , 126N, (as possibly controlled e.g., by the communication unit U, via respective lines designated collectively 126c) may permit to select if and which ones (that is the number and/or the inductance values) of the inductors in the plurality 1241, 1242, . . . , 124N may be made active (that is non short-circuited) between the taps 1220a, 1220b.

In one or more embodiments, this may provide additional flexibility in selectively varying the inductance value between the taps 1220a, 1220b in providing adaptive line coupling ("tuning") between the communication unit U and the power line PL.

In fact, in one or more embodiments as exemplified in FIG. 1, the inductance value between the taps 1220a, 1220b may be varied between zero (with the—single—inductor 124 short-circuited) and the inductance value of the (single) inductor 124 (when active. In addition, in one or more embodiments as exemplified in FIG. 2, the inductance value between the taps 1220a, 1220b may be varied between zero (with all the inductors 1241, 1242, . . . , 124N short-circuited) and a plurality of non-zero values as provided by all the possible combinations of the number/values of the inductors 1241, 1242, . . . , 124N, when active.

By way of mere example, in the case of an embodiment including two inductors 1241, 1242 arranged in series and having inductance values L1 and L2, respectively, four different nominal values may be provided for the inductance value between the taps 1220a, 1220b, namely:

zero: with both inductors 1241, 1242 short-circuited;
L1: with inductor 1241 active (that is non short-circuited) and inductor 1242 short-circuited
L2: with inductor 1241 short-circuited and inductor 1242 active (that is non short-circuited;
L1+L2: with both inductors 1241, 1242 active (that is non short-circuited).

One or more embodiments may thus provide a coupling circuit (e.g., 10) for power line communications, the circuit including a coupling transformer having first (e.g., 121) and second (e.g., 122) mutually coupled windings, the first winding connectable to a power line (e.g., PL). The second winding includes a pair of intermediate taps (e.g., 1220a, 1220b) with at least one tuning inductor (e.g., 124—FIG. 1; 1241, 1242, . . . , 124N—FIG. 2) therebetween, wherein the at least one inductor is set between a first portion (e.g., 122a) and a second portion (e.g., 122b) of the second winding of the coupling transformer. At least one switch member (126—FIG. 1; 1261, 1262, . . . , 126N—FIG. 2) is provided coupled with the at least one inductor, the switch member selectively actuatable (e.g., via the line 126c) to short-circuit the at least one inductor.

In one or more embodiments, the at least one switch member may include at least one transistor, optionally a MOSFET, such as a NMOS transistor.

In one or more embodiments, the at least one switch member may include a pair of complementary switches (e.g., 126a, 126b) having a common control electrode (e.g., the gate in the case of FETs).

In one or more embodiments, the at least one switch member may include a pair of transistors with their current paths (e.g., source-drain in the case of FETs) arranged in series.

One or more embodiments may include a plurality of tuning inductors (e.g., 1241, 1242, . . . , 124N in FIG. 2) between the pair of intermediate taps of the second winding of the coupling transformer, wherein the plurality of inductors are set between the first portion and the second portion of the second winding of the coupling transformer. One or more embodiments may also include a plurality of switch members (e.g., 1261, 1262, . . . , 126N in FIG. 2) each coupled with a respective one inductor in the plurality of inductors, each switch member in the plurality of switch members selectively actuatable to short-circuit a respective one inductor in the plurality of inductors.

One or more embodiments may include a tuning capacitor (e.g., 128) coupled with the first winding of the coupling transformer, optionally by being arranged in series with the first winding (a parallel arrangement may be contemplated in one or more embodiments).

One or more embodiments may provide a communication device, including a communication unit (e.g., U) for exchanging communication signals over a power line (PL), and a coupling circuit (e.g., 10) according to one or more embodiments, the communication unit coupled to the second winding of the coupling circuit.

In one or more embodiments the communication unit may be configured (e.g., at 126c) for selectively making the at least one switch member conductive and non-conductive.

One or more embodiments may provide a power line communication network, the network including at least one power line (e.g., PL) and a communication device (e.g., U, 10) according one or more embodiments, the communication device having the first winding of the coupling circuit (10) coupled with the power line.

One or more embodiments may include a method of providing a coupling between a power line and a communication unit (e.g., U) for exchanging communication signals over the power line, the method including setting between the power line and the communication unit a coupling circuit (10) according to one or more embodiments, the coupling circuit having the first winding coupled with the power line (e.g., PL).

One or more embodiments, the method may include connecting to the power line a communication device according to one or more embodiments.

The various embodiments and alternatives described herein can be combined in any suitable manner.

Without prejudice to the underlying principles, the details and the embodiments may vary, even significantly, with respect to what has been described herein made by way of example, without departing from the extent of protection.

The extent of protection is defined by the annexed claims.

What is claimed is:

1. A circuit for communication over a power line, the circuit comprising:
   a coupling transformer comprising a primary winding mutually coupled to a secondary winding, the primary winding coupled to the power line; and
   a tuning circuit coupled to the secondary winding, the tuning circuit comprising a plurality of switchable inductors arranged in series, each of the plurality of switchable inductors comprising an inductor arranged in parallel with a respective switch.

2. The circuit of claim 1, further comprising a communication unit coupled to each switch of the plurality of switchable inductors, the communication unit configured to:
   exchange communication signals over the power line; and
   short circuit one or more inductors of the tuning circuit to provide a tuned impedance between the communication unit and the power line.

3. The circuit of claim 1, wherein the inductor in each of the plurality of switchable inductors comprises of a different or a same inductance value.

4. The circuit of claim 1, wherein the primary winding comprises a first node and a second node, the primary winding coupled to the power line at the first node through a capacitor arranged in series between the primary winding and the power line.

5. The circuit of claim 1, wherein the secondary winding comprises a first secondary winding and a second secondary winding.

6. The circuit of claim 5, wherein the tuning circuit comprises a first node and a second node, the first node coupled to the first secondary winding and the second node coupled to the second secondary winding.

7. The circuit of claim 1, wherein each switch of the tuning circuit comprises a transistor.

8. A method of communication over a power line, the method comprising:
   determining, by a communication unit, a tuned impedance for communication over the power line;
   selecting, by the communication unit, a circuit configuration of a tuning circuit in accordance with the tuned impedance, the circuit configuration of the tuning circuit comprising selective arrangement of one or more inductors in series; and communicating, by the communication unit, communication signals over the power line.

9. The method of claim 8, wherein selecting the circuit configuration comprises selectively actuating the one or more inductors using a respective switch arranged in parallel with each inductor.

10. The method of claim 8, wherein selecting the circuit configuration comprises short circuiting the one or more inductors using a respective switch arranged in parallel with each inductor.

11. The method of claim 8, wherein the tuning circuit is coupled to a secondary winding of a transformer that is mutually coupled to a primary winding of the transformer, the primary winding coupled to the power line.

12. The method of claim 11, wherein the one or more inductors are arranged in series between a first secondary winding and a second secondary winding of the secondary winding.

13. The method of claim 11, wherein the secondary winding is coupled to a low-voltage side of the transformer and the primary winding is coupled to a high-voltage side of the transformer.

14. The method of claim 8, wherein the communication signals are a uni-directional or a bi-directional transmission over the power line.

15. A circuit for communication over a power line, the circuit comprising:

a coupling transformer comprising a primary winding mutually coupled to a secondary winding, the primary winding coupled to the power line, the secondary winding comprising a first secondary winding and a second secondary winding; and a switchable inductor arranged in series between the first secondary winding and the second secondary winding, the switchable inductor comprising an inductor arranged in parallel with a switch.

16. The circuit of claim 15, further comprising a communication unit coupled to the switchable inductor, the communication unit configured to:

exchange communication signals over the power line; and short circuit the inductor to provide a tuned impedance between the communication unit and the power line.

17. The circuit of claim 16, wherein the switch is a first switch, the switchable inductor further comprising a second switch coupled in a mirror-like arrangement with the first switch.

18. The circuit of claim 17, wherein a control terminal of the first switch and a control terminal of the second switch is a common control terminal driven by a control signal from the communication unit.

19. The circuit of claim 18, wherein a current sink terminal of the first switch is coupled to a current sink terminal of the second switch.

20. The circuit of claim 18, wherein a current generating terminal of the first switch is coupled to the first secondary winding, and wherein a current generating terminal of the second switch is coupled to the second secondary winding.

* * * * *